United States Patent [19]

Cliff et al.

[11] Patent Number: 5,485,102

[45] Date of Patent: Jan. 16, 1996

[54] PROGRAMMABLE LOGIC DEVICES WITH SPARE CIRCUITS FOR REPLACEMENT OF DEFECTS

[75] Inventors: Richard G. Cliff, Milpitas; Rina Raman, Fremont; Srinivas T. Reddy, Santa Clara, all of Calif.

[73] Assignee: Altera Corporation, San Jose, Calif.

[21] Appl. No.: 416,296

[22] Filed: Apr. 4, 1995

Related U.S. Application Data

[63] Continuation of Ser. No. 979,003, Nov. 19, 1992, Pat. No. 5,434,514.

[51] Int. Cl.$^6$ ............................................. H03K 19/177
[52] U.S. Cl. ............................ 326/10; 326/38; 326/39; 326/41
[58] Field of Search ........................... 326/10, 12, 13, 326/38, 39, 40, 41; 371/8.1, 10.1, 10.2, 10.3, 11.1

[56] References Cited

U.S. PATENT DOCUMENTS

| Re. 33,521 | 1/1991 | Mori et al. ............................. | 364/200 |
|---|---|---|---|
| 3,805,039 | 4/1974 | Stiffler ................................... | 371/8.1 |
| 3,995,261 | 11/1976 | Goldberg ............................ | 340/173 BB |
| 4,020,469 | 4/1977 | Manning .............................. | 340/172.5 |
| 4,566,102 | 1/1986 | Hefner .................................. | 371/11 |
| 4,609,986 | 9/1986 | Harmann et al. .................... | 364/200 |
| 4,617,479 | 10/1986 | Hartmann et al. ................... | 307/465 |
| 4,677,318 | 6/1987 | Veenstra ............................... | 307/465 |
| 4,691,301 | 9/1987 | Anderson ............................. | 365/200 |
| 4,706,216 | 11/1987 | Carter ................................... | 365/94 |
| 4,713,792 | 12/1987 | Hartmann et al. ................... | 364/900 |
| 4,722,084 | 1/1988 | Morton ................................. | 371/9.1 |
| 4,774,421 | 9/1988 | Hartmann et al. ................... | 307/465 |
| 4,798,976 | 1/1989 | Curtin et al. ........................ | 307/441 |
| 4,800,302 | 1/1989 | Marum ................................. | 307/441 |
| 4,871,930 | 10/1989 | Wong et al. ......................... | 307/465 |
| 4,899,067 | 2/1990 | So et al. . | |

(List continued on next page.)

FOREIGN PATENT DOCUMENTS

| 0351983A3 | 1/1990 | European Pat. Off. | ......... G06F 11/20 |
|---|---|---|---|
| 0361404A3 | 4/1990 | European Pat. Off. | ......... G06F 11/20 |
| 0437081A2 | 7/1991 | European Pat. Off. | ......... G06F 11/20 |
| 0596453A2 | 5/1994 | European Pat. Off. | ......... G06F 11/20 |

OTHER PUBLICATIONS

"Introducing Redundancy in Field Programmable Gate Array"; by F. Hatori; Proceedings of the IEEE 1993 Custom Integrated Circuits Conference held in San Diego, Calif.; May 9–12, 1993; pp. 7.1.1–7.1.4.

"Preliminary Data, Altera 32 Macrocell High Density Max EPLD EPM 5032," 1988, Altera Corporation, Santa Clara (now San Jose), Calif.

*Recent–Developments in Switching Theory*, A Mukhopadhyay, ed., Academic Press, New York, 1971, chapters VI and IX, pp. 229–254 and 369–422.

"A Survey of Microcellular Research," R. C. Minnick, Journal of the Association of Computing Machinery, vol. 14, No. 2, pp. 203–241, Apr. 1967.

"Programmable Logic Arrays—Cheaper by the Millions," S. E. Wahlstrom, Electronics, Dec. 1967, pp. 90–95.

"Programmable Logic Devices with Spare Circuits for Use in Replacing Defective Circuits", 1988, Altera Corporation, San Jose, Calif.

*Primary Examiner*—Edward P. Westin
*Assistant Examiner*—Benjamin D. Driscoll
*Attorney, Agent, or Firm*—Fish & Neave; Robert R. Jackson; G. Victor Treyz

[57] ABSTRACT

A programmable, integrated circuit, logic array device has several regular logic groups and at least one spare logic group. If any of the regular logic groups is defective, the spare logic group is used to make up for the defective logic group. To accomplish this, programming and data input signals that would normally go to the defective logic group are redirected to another logic group. The data output signals of the other group are substituted for the data output signals of the logic group that would normally have received the programming and data input signals that were redirected to the other logic group.

29 Claims, 3 Drawing Sheets

U.S. PATENT DOCUMENTS

| | | | |
|---|---|---|---|
| 4,912,342 | 3/1990 | Wong et al. | 307/465 |
| 5,019,736 | 5/1991 | Furtek . | |
| 5,121,006 | 6/1992 | Pedersen | 307/465 |
| 5,187,393 | 2/1993 | El Gamal et al. | 307/465.1 |
| 5,204,836 | 4/1993 | Reed | 365/200 |
| 5,220,214 | 6/1993 | Pedersen | 307/465 |
| 5,260,610 | 11/1993 | Pedersen et al. | 307/465 |
| 5,260,611 | 11/1993 | Cliff et al. | 307/465 |
| 5,369,314 | 11/1994 | Patel | 326/39 |

PROGRAMMABLE LOGIC DEVICES WITH SPARE CIRCUITS FOR REPLACEMENT OF DEFECTS

This is a continuation of application Ser. No. 07/979,003, filed Nov. 19, 1992, now U.S. Pat. No. 5,434,514.

BACKGROUND OF THE INVENTION

This invention relates to programmable logic devices, and more particularly to programmable logic array integrated circuits with spare circuits for replacement of other circuits which may be defective.

So et al. U.S. Pat. No. 4,899,067 shows programmable logic devices having sum-of-products logic which is subdivided into relatively small units called macrocells. In order to salvage parts which may have been defectively manufactured, the So et al. patent shows including extra macrocells (or extra word lines or bit lines which form portions of the macrocells or the structures used for interconnecting the macrocells). When a macrocell (or a word line or bit line) is found to be defective, the defective circuitry is switched out of service and the spare circuitry is switched into service to make up for the capacity that would otherwise be lost. In this way parts which would otherwise have to be scrapped can be salvaged and used exactly as though they were defect-free.

The So et al. invention works extremely well. However, because the replacement of defective parts takes place on the relatively small-scale level of individual macrocells (or individual word lines or bit lines), a relatively large amount of additional control circuitry is required. For example, in products of the size described in the So et al. patent (e.g., the so-called Max 5000 EPLD available from Altera Corporation of San Jose, California) over 2000 fuses are required to control the use of the spare circuitry. This is a substantial "overhead penalty" to allow defective parts to be salvaged and used. Also, while "repair" on a relatively small-scale basis (as in the So et al. patent) is good for "point" or relatively small defects, it would be desirable to have a strategy for repair on a larger scale, which strategy would be more effective for repairing larger or more severe defects.

In view of the foregoing, it is an object of this invention to improve and simplify the provision and use of spare circuits in programmable logic devices.

It is another object of this invention to provide programmable logic devices with spare circuits for replacement of defective circuits on a relatively large scale so that the overhead associated with controlling the use of the spare circuits can be substantially reduced and so that larger or more severe defects can be more effectively overcome.

SUMMARY OF THE INVENTION

These and other objects of the invention are accomplished in accordance with the principles of the invention by identifying relatively large, repeating portions of a programmable logic device which have relatively few connections to other circuitry, and providing spare circuitry for replacing such a portion in its entirety in the event that such a portion is found to be defective. In order to control use of the spare circuitry, control circuitry is provided for switching the programming signals that would normally go to a defective circuit portion to another nondefective circuit portion. Control circuitry is also provided for switching data inputs that would normally go to the defective circuit portion to the non-defective circuit portion. Control circuitry also switches data outputs from the non-defective portion back to the destinations of the outputs of the defective circuitry. Accordingly, the circuit as a whole functions just as though it were defect-free. For example, the external input and output pins are used identically regardless of whether the circuit is in fact perfect, or has been repaired by the use of the spare circuitry. Similarly, the chip accepts exactly the same programming data whether perfect or repaired. Because defective circuitry is replaced on a relatively large scale, relatively few additional elements are required to control such replacement. The overhead penalty for controlling the spare circuitry is therefore relatively small.

Further features of the invention, its nature and various advantages, will be more apparent from the accompanying drawings and the following detailed description of the preferred embodiments.

DETAILED DESCRIPTION OF THE PREFERRED EMBODIMENT

Figure 1:
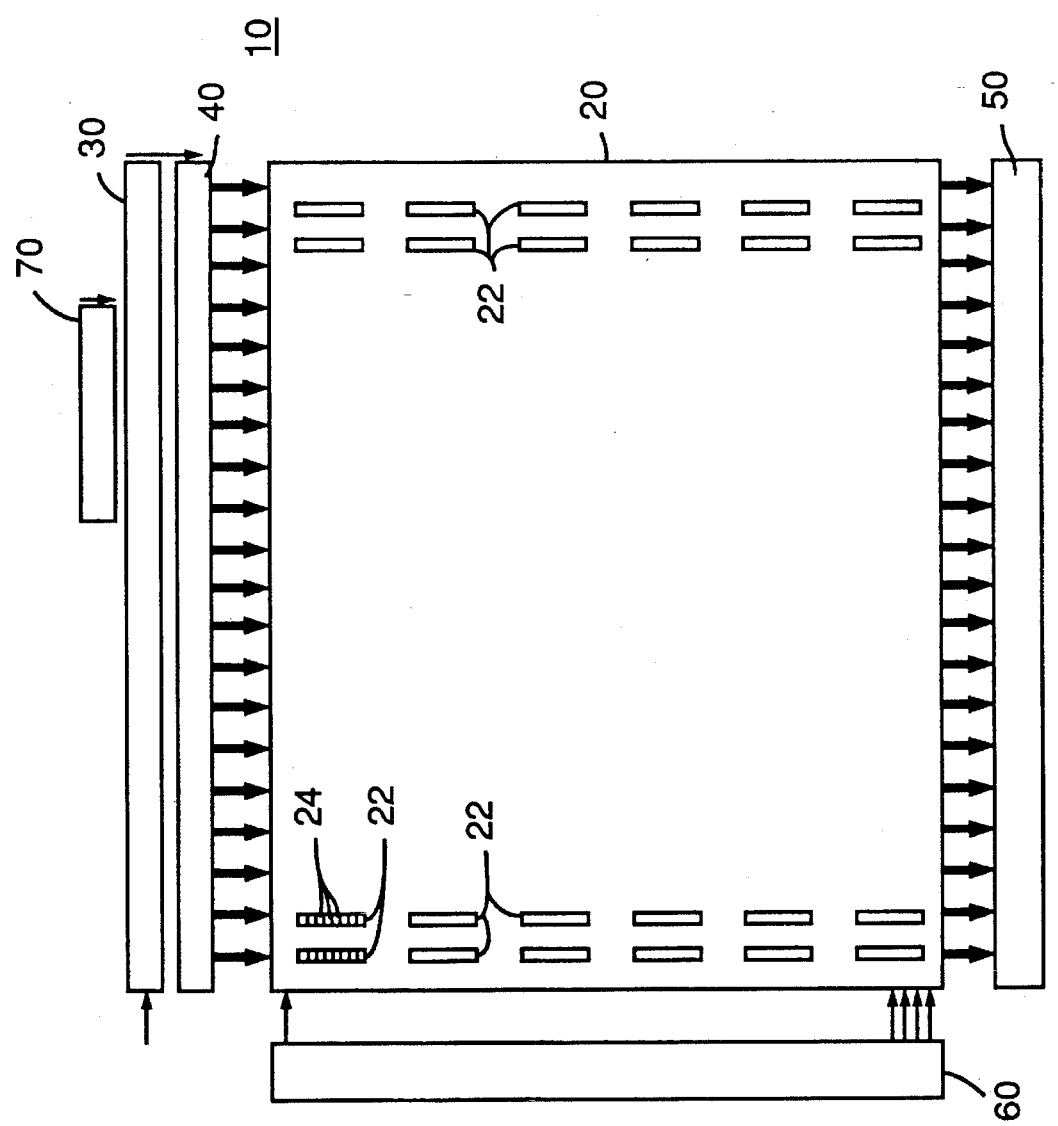
FIG. 1 is a simplified block diagram of an illustrative programmable logic array integrated circuit which can be constructed in accordance with the principles of this invention.

For purposes of illustration the invention will be described in the context of programmable logic array integrated circuits of the type shown in commonly assigned, co-pending patent application Ser. No. 880,942, filed May 8, 1992, which is hereby incorporated by reference herein. It will be understood, however, that the invention is equally applicable to many other types of programmable logic devices.

As shown in FIB. 1, an illustrative programmable logic array integrated circuit 10 which can be constructed in accordance With this invention includes the following elements: (1) RAM (random access memory) array 20 in which the device performs digital logic as will be described in more detail below; (2) a first (serial) data register 30 into which data needed to program array 20 is shifted (e.g., from left to right as viewed in FIG. 1); (3) a second (parallel) data register 40 into which programming data from register 30 is shifted in parallel each time register 30 has been filled; (4) test register 50 for receiving programming data passed through all of the memory elements in array 20 from register 40 in order to test the proper functioning of the memory elements; (5) address register 60 for successively addressing horizontal rows of memory elements in array 20 to cause the addressed memory elements to store the programming data applied to them from register 40; and (6) fuse register 70 for controlling the use of the spare circuits in array 20 which are provided in case regular circuits in array 20 are found to be defective.

The logic in array 20 is subdivided into units called logic array blocks ("LABS") 22. As viewed in FIG. 1 LABs 22 are arranged in horizontal rows and vertical columns. In the depicted illustrative embodiment there are 21 columns of "regular" LABs 22 and one column (i.e., the left-most column) of "spare" LABs 22. Each regular and spare column has six LABs 22.

Each of LABs 22 is in turn subdivided into eight logic modules 24. Each logic module is capable of performing a relatively simple logical operation (e.g., providing an output signal which is any logical function of four input signals applied to the logic module).

Figure 2:
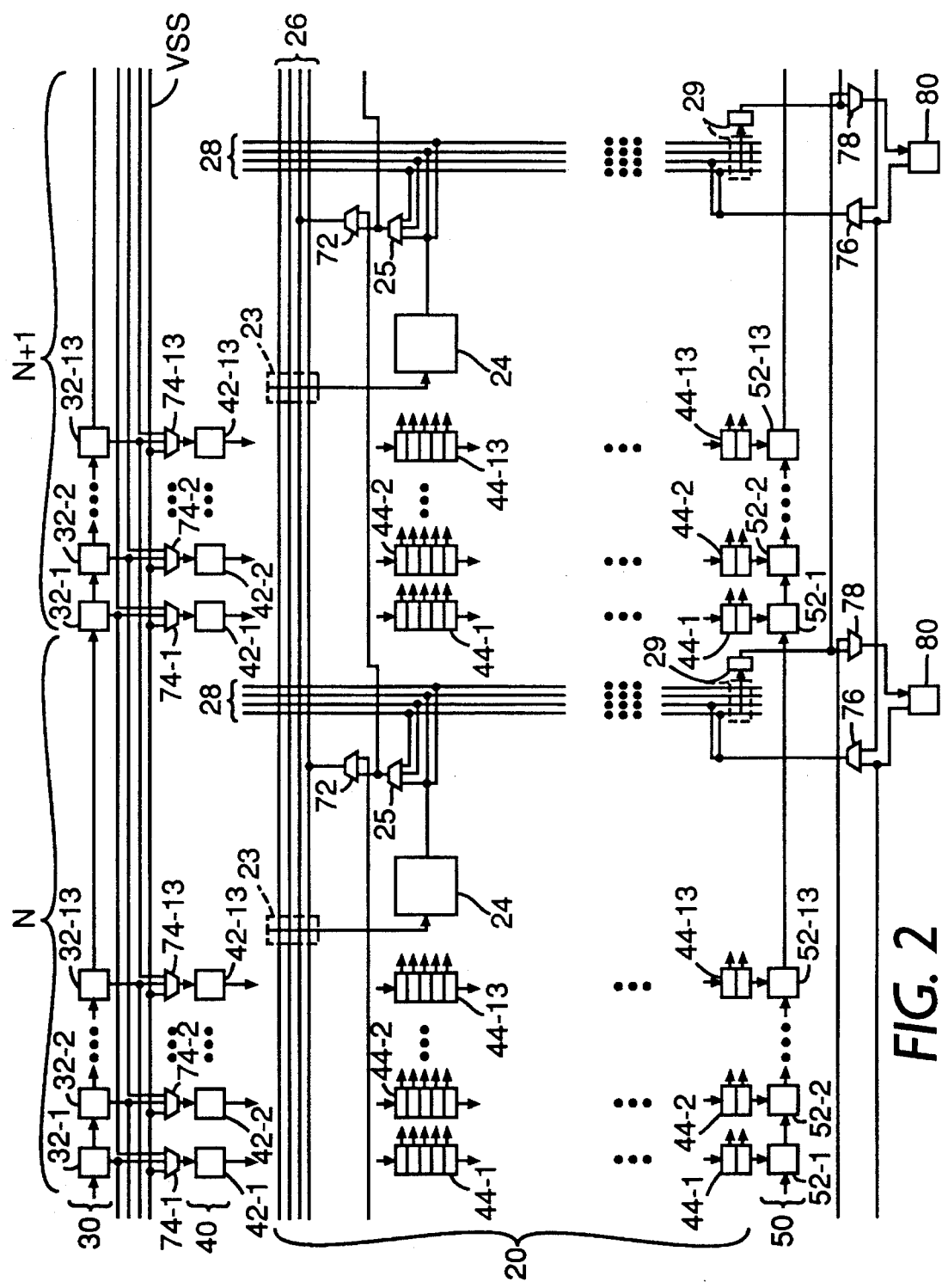
FIG. 2 is a more detailed, but still simplified schematic block diagram of representative portions of the circuit of FIG. 1 showing an illustrative embodiment of this invention.

Not shown in FIG. 1, but shown in FIG. 2 and also shown in above-mentioned application Ser. No. 880,942, array 20 also includes a network of conductors for interconnecting logic modules 24 in various ways so that much more complex logic functions can be performed by combining logic module output signals. (FIG. 2 shows portions of two representative LAB columns N and N+1.) In particular, several "global horizontal" conductors 26 are associated with each horizontal row of LABs 22. Similarly, several "global vertical" conductors 28 are associated with each vertical column of LABs 22. Only a few of these global conductors are shown in FIG. 2 to avoid over-complicating the drawing. For example, there may actually be approximately 168 global horizontal conductors 26 associated with each LAB row and 16 global vertical conductors 28 associated with each LAB column. FIG. 2 is also simplified by omitting amplifier or driver circuits which are typically provided on many of the depicted conductors. Some of these omitted elements may be programmable tri-state drivers.

The output signal of each logic module 24 is applied to two of the vertical conductors 28 associated with the LAB column which includes that logic module. The output signal of each logic module 24 can also be applied via associated switches 25 and 72 to a respective one of the global horizontal conductors 26 associated with the LAB row which includes that logic module. Assuming that neither of columns N and N+1 is involved in any shifting of functions to make up for a circuit defect occurring in a column to the right, the output signal of the switch 25 in each column is applied to a global horizontal conductor via the associated switch 72 in that column. (For reasons which will become more apparent as the discussion proceeds, the left-most spare LAB column is like all other columns in that it includes global vertical conductors 28. It also includes switches 25. But it does not include its own set of switches 72 and connections to global horizontal conductors 26.) Each switch 25 can alternatively be used to connect one of two of the associated global vertical conductors 28 to the global horizontal conductor 26 associated with that switch 25. Again, assuming that neither of columns N and N+1 is involved in any shifting of functions associated with the use of the spare LAB column, this connection is made via the switch 72 in the same column as the switch 25 providing the signal to be connected.

The signals on any of several (e.g., four) of the global horizontal conductors 26 associated with the row including a logic module 24 can be applied as inputs to the logic module via the associated programmable logical connection device 23. As noted above, the output signal of each logic module 24 is preferably programmable to be any logical function of these inputs. Alternative or additional inputs to each logic module may be the output of the same logic module or other logic modules in the same LAB 22. This last point is shown and described in more detail in abovementioned application Ser. No. 880,942.

The foregoing describes the flow of logic signals within device 10, primarily when neither of columns N and N+1 is involved in any shifting of functions associated with the use of the spare left-most column. FIG. 2 also shows some of the circuitry 30, 40, 50, etc. associated with initially programming device 10, and also some of the input/output pins 80 usable for applying external data signals to or obtaining data output signals from device 10.

Considering first the programming circuitry, serial data register 30 is made up of a plurality of shift register stages 32. Each regular column has several (e.g., 13) associated stages 32-1 through 32-13. Programming data is shifted into register 30 from left to right. When register 30 is full, the programming data is transferred in parallel from register 30 to the stages 42 of register 40. Assuming that columns N and N+1 are not involved in any shifting of functions to the spare column, the shift from register 30 to register 40 is straight down via the switches 74 associated with each column.

The output of each register stage 42 is applied to a respective chain of first-in first-out (FIFO) memory cells 44 in array 20. Initially, each of these FIFO chains (if operating properly) merely passes the applied data through to an associated stage 52 of test register 50. The contents of test register 50 can be shifted out from left to right in order to ensure that all of cells 44 are functioning properly. Thereafter, address register 60 (FIG. 1) is used to successively address rows of cells 44 from the bottom to the top as viewed in FIG. 2 so that data successively loaded into register 40 is latched into cells 44 in order to program the device. When thus programmed, each cell 44 in each FIFO chain controls an associated function in the associated LAB column. For example, some of cells 44 control the connections made by associated element 23. Other cells 44 control the logical function performed by associated logic module 24. Still other cells 44 control the connection made by associated switch 25. This technique for programming device 10 is shown and described in more detail in commonly assigned, co-pending patent application Ser. No. 880,903, filed May 8, 1992, which is hereby incorporated by reference herein.

Although as noted above, only regular LAB columns have associated stages 32 in register 30, all LAB columns (i.e., both regular and spare) have associated stages 42 and 52 in registers 40 and 50. All LAB columns also have associated switches 74, although the switches 74 for the spare column and the right-most regular column have only two inputs rather than three as will be described in more detail below.

Turning now to input/output pins 80, each group of global verticals conductors 28 associated with a regular LAB column typically has several pins 80 associated with it, although only one representative pin is shown associated with each group 28 in FIG. 2. Each pin 80 can be used either as an input or an output pin. When used as an input pin, the external signal applied to the pin is applied to two of the associated vertical conductors 28 via the switch 76 in the column associated with those conductors (assuming that neither column N nor N+1 is involved in any shifting of functions associated with the use of the spare column). When used as an output pin, the associated programmable logical connection device 29 applies the signal on one of the associated vertical conductors 28 to the pin 80 via the switch 78 in the associated column (again assuming that neither column N nor N+1 is involved in any shifting of functions associated with use of the spare column). Connection devices 29 (like connection devices 23) are among the programmable elements controlled by cells 44. Because (as noted above) the spare LAB column has no associated input/output pins 80, the spare column does not include its own switches 76 and 78. The spare column does, however, include its own connection devices 29. The spare column may include a fuse-controlled-switch like switch 76 to turn off the input connections from the pins 80 associated with the left-most regular column in the event that the spare column is not needed. This avoids double loading of the pins 80 associated with the left-most regular column. Although these fuse-controlled switches are different from depicted switches 76 because they have only one input, they may be thought of as similar to switches 76 and will be hereinafter referred to as the switches 76 associated with the spare column. Similarly, it will be apparent that the switches 76 associated with the right-most regular column have only one input each and can therefore also be simple on/off switches for avoiding double loading of the pins 80 associated with the right-most regular column when that column is found to be defective and its functions are accordingly shifted left one column.

To complete the discussion of the basic circuitry, it should be said that elements 72, 74, 76, and 78 are controlled by fuse register 70 (FIG. 1). In particular, fuse register 70 includes one fuse for each regular LAB column. Thus in the depicted preferred embodiment in which there are 21 regular LAB columns, fuse register 70 includes 21 fuses. The state of each fuse (i.e., whether the fuse is "blown" or intact) indicates whether the functions normally performed by the associated LAB column are to be performed by that column or are to be shifted one LAB column to the left. The fuse associated with each column controls the switches 72, 76, and 78 in that column, and partly controls the switches 74 in that column. The remaining control for switches 74 in each column comes from the fuse associated with the column to the right. The reason for this will become apparent below. The switches 74 and 76 for the spare column can be controlled by the fuse for the left-most regular column, or register 70 can include an additional fuse for controlling those spare column switches.

Figure 3:
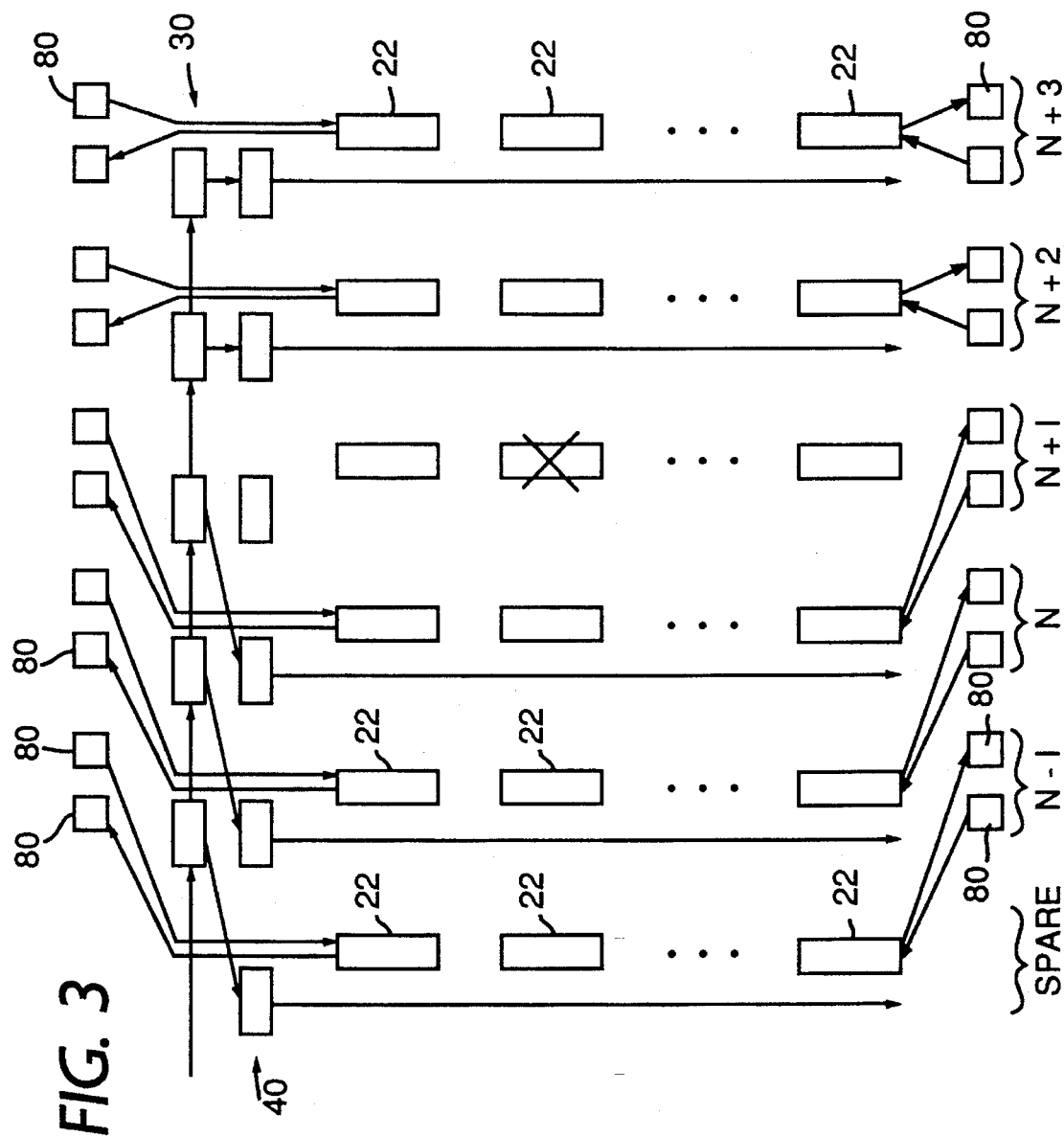
FIG. 3 is a simplified block diagram of a portion of the circuit of FIG. 1 showing how programming signals and certain other signals are redirected around defective circuitry in an embodiment of the invention such as is shown in FIG. 2.

The foregoing discussion assumes that representative columns N and N+1 are not involved in any shifting of functions required to place the spare (left-most) LAB column into use to compensate for a defect in one of the regular columns. FIG. 3 shows how the functions of certain columns are shifted when a defect is detected in one of the regular columns. In the example shown in FIG. 3, LAB column N+1 contains a defect and therefore cannot be used. LAB columns to the right of column N+1 are unaffected. The columns to the right of column N+1 are therefore programmed and function exactly as though the entire chip were defect free. The programming data that would normally go to column N+1, however, is shifted one column to the left (i.e., to column N) so that column N can perform all the functions that would normally be performed by column N+1. Similarly, the programming data that would normally go to column N is shifted one column to the left to column N-1 so that column N-1 performs all the functions normally performed by column N. This leftward shifting of programming data and functions continues until the programming data and functions of the left-most regular column are shifted to the spare column. To indicate that this is how the programming data and functions are to be handled, the fuse in fuse register 70 associated with LAB column N+1 (the defective column) is blown. This is done after the chip has been tested to determine which column (if any) contains a defect.

Considering now in more detail how the foregoing shifting of programming data and functions is accomplished in FIG. 2, when column N+1 is the defective one, switches 74 in that column receive a combination of inputs from fuse register 70 indicating that the column to the right of column N+1 is not involved in any shifting but that the functions of column N+1 are to be shifted. In response to this combination of inputs, each of switches 74 applies VSS (logical 0) to the associated stage 42 of register 40. This eventually causes all memory cells 44 in column N+1 to store logical 0, thereby shutting down as much as possible of the circuitry of defective column N+1 so that the unused circuitry in that column does not waste power. At the same time, switches 74 in column N receive a combination of inputs from fuse register. 70 which indicates that columns N and N+1 are both involved in shifting. This causes the switches 74 in column N to connect the outputs of the stages 32 of register 30 in column N+1 to the stages 42 of register 40 in column N. This shifts the programming data that would normally go to column N+1 to column N. The switches 74 for all of the columns to the left of column N (including the spare column) operate similarly to shift the programming data one column to the left during transfer of that data from register 30 to register 40. It will be appreciated that the switches 74 for the spare column only require two inputs (VSS (selected when the spare column is not used and can therefore be turned off because the chip is defect free) and the outputs of the stages 32 of register 30 associated with the left-most regular column (selected when any regular column is defective and the spare column must therefore be put to use)). Similarly, it will be understood that the switches 74 in the right-most regular column require only two inputs (VSS (selected when the right-most column is defective) and the outputs of the stages 32 of register 30 in the right-most column (selected when VSS is not selected)).

Because the programming data is thus automatically routed away from any defective column, absolutely no change in the programming data is required even though the chip may contain a defect. The fault correction is therefore completely transparent to the programmer of the chip.

Considering now the operation of the chip to perform logic when the functions of some of the LAB columns are shifted as described above, all horizontally aligned logic modules 24 have exactly the same input connection options 23 from horizontal conductors 26. Accordingly, shifting the programming data which controls connections 23 left one column causes the logic module to the left to receive exactly the same inputs that the original logic module would have received. Similarly, all horizontally aligned logic modules 24 have exactly the same pattern of outputs to vertical conductors 28, and all horizontally aligned switches 25 have the same pattern of inputs from the vertical conductors so that shifting programming data left does not alter the pattern of these vertical conductor connections. However, horizontally aligned switches 25 do not have the same output connections to horizontal conductors 26. Switches 72 are therefore provided to apply the output signal of the switches 25 in each shifted column to the horizontal conductors that would receive the output signals of the corresponding switches 25 in the normal column.

Considering again the example in which column N+1 is defective and therefore has its functions performed by column N, the depicted representative switch 72 in column N+1 is controlled by the fuses in register 70 (appropriately decoded) to apply the output of depicted representative switch 25 in column N to the horizontal conductor 26 that would normally receive the output signal of depicted representative switch 25 in column N+l. Similarly, switch 72 in column N is controlled by the fuses in register 70 to apply the output of switch 25 in column N-1 (not shown but to the left of column N) to the horizontal conductor 26 that would normally receive the output signal of switch 25 in column N. In this way, even though the functions of several columns are shifted to the left one column, the switch 25 outputs always get back to the originally intended horizontal conductors 26. Again this is done automatically so that it is completely transparent to the user of the chip.

Shifting the functions of various columns to the left also must not alter the functions of the input/output pins 80 served by the vertical conductors 28 in the several columns. The pins 80 associated with all columns have the same patterns of possible input and output connections to the vertical conductors 28 in the associated columns. Switches 76 are provided to switch inputs from the pins 80 associated with a column involved in a shifting of functions from the vertical conductors 28 in the column that would normally receive those inputs to the vertical conductors in the column to the left. Similarly, switches 78 are provided to switch outputs from the vertical conductors 28 in a column involved in a shifting of functions back to the pins 80 associated with the column to the right. For example, if column N is being used to perform the functions of column N+1, depicted representative switch 76 in column N is controlled by the fuses in register 70 (FIG. 1) to apply any input signal applied to depicted representative pin 80 in column N+1 to the vertical conductors 28 in column N. Similarly, depicted representative switch 78 in column N+1 is controlled by the fuses in register 70 to apply any output signal from the depicted representative connection device 29 in column N to depicted representative pin 80 in column N+1. In this way, the signals associated with each pin 80 always remain the same even though the source or destination of those signals may be the vertical conductors 28 in the column normally associated with that pin or the vertical conductors 28 in the column to the left of the column normally associated with that pin. Again, this possible shifting of signals associated with pins 80 is automatic and completely transparent to the user of the chip.

It will be understood that the foregoing is merely illustrative of the principles of the invention, and that various modifications can be made by those skilled in the art without departing from the scope and spirit of the invention. For example, although only one spare column is shown in the depicted preferred embodiment, it will be understood that two or more spare columns can be provided if desired. Moreover, if multiple spare columns are provided, they can either be grouped together or distributed among the regular columns. As another example of modifications within the scope of this invention, spare circuitry could be provided for allowing replacement of defective rows rather than columns of circuits. Or both rows and columns could be replaced. Instead of being made up of fuses, register 70 could be made up of storage or memory cells of many other types such as RAM cells, antifuses, metal optional links, EPROMs, EEPROMs, ferro-electric elements, or the like. As still another alternative, register 70 could be a two-stage register having a first stage which is loadable and reprogrammable so that Various defect-correction patterns can be tested. Then when a satisfactory defect correction pattern is found, that pattern is "burned into" the second stage of the register 70 which thereafter controls the allocation of functions among the regular and spare circuit groups. As yet another example of modifications within the scope of the invention, some of conductors 28 could be used to convey input signals to the associated logic modules 24.

The invention claimed is:

1. A programmable, integrated circuit, logic array device comprising:

a plurality of regular logic groups and at least one spare logic group, each of said logic groups having a plurality of programming signal input terminals, a plurality of data input terminals, a plurality of data output terminals, and a programmable programming signal memory for storing programming signals applied to said programming signal input terminals of said logic group in order to control subsequent operation of said logic group;

a register distinct from the programming signal memories of said logic groups for temporarily storing programming input signals to be applied to said programming signal input terminals prior to storage of said programming input signals in said programming signal memories; and a first plurality of switches for simultaneously applying all of the programming input signals stored in said register to all of the programming signal input terminals of either all of said regular logic groups or said spare logic group and a subset of said regular logic groups so that said spare logic group takes the place of a regular logic group which is not included in said subset.

2. The apparatus defined in claim 1 wherein said register comprises a plurality of groups of plural register stages, the register stages in each group storing the programming input signals which are normally applied to a respective associated one of said regular logic groups, each switch in said first plurality of switches comprising:

first switch circuitry connected between an associated register stage and a respective one of the programming signal input terminals in the associated regular logic group; and second switch circuitry connected between said associated register stage and a respective one of the programming signal input terminals in another logic group.

3. The apparatus defined in claim 1 further comprising:

memory circuitry associated with each of said regular logic groups for indicating whether or not said regular logic group is defective.

4. The apparatus defined in claim 3 wherein said memory circuitry is selected from the group consisting of fuses, antifuses, RAM cells, metal optional links, EPROMs, EEPROMs, and ferro-electric elements.

5. The apparatus defined in claim 1 wherein said regular and spare logic groups are disposed on said integrated circuit in an ordered sequence, said spare logic group being at one end of said sequence, and wherein each of said first plurality of switches applies a programming input signal applied to it to a programming signal input terminal of either of two adjacent logic groups in said sequence.

6. The apparatus defined in claim 1 wherein each of said logic groups further includes a plurality of first conductors for selectively conveying data signals from the data output terminals of said logic group.

7. The apparatus defined in claim 6 further comprising:

a plurality of second conductors for selectively conveying data signals between said logic groups.

8. The apparatus defined in claim 7 further comprising:

a second plurality of switches, each of which connects a second conductor to a first conductor in either of two logic groups.

9. The apparatus defined in claim 8 wherein said logic groups are paired in predetermined pairs, and wherein each switch in said second plurality of switches connects a second conductor to a first conductor in either of the two logic groups in a predetermined pair of logic groups.

10. The apparatus defined in claim 9 wherein each switch in said first plurality of switches applies a programming input signal stored in said register to a programming signal input terminal in either of the two logic groups in a predetermined pair of logic groups.

11. The apparatus defined in claim 6 wherein each of said logic groups further includes a plurality of second conductors for selectively conveying data signals to the data input terminals of said logic group, and wherein said apparatus further comprises:

at least one input pin normally functionally associated with each regular logic group; and a second switch associated with each input pin for connecting each input pin to either a second conductor in the regular logic group associated with that input pin or a second conductor in another logic group.

12. The apparatus defined in claim 11 wherein said logic groups are paired in predetermined pairs, and wherein each second switch connects the associated input pin to either a second conductor in the regular logic group associated with that input pin or a second conductor in the other logic group in the predetermined pair which includes the regular logic group associated with that input pin.

13. The apparatus defined in claim 12 wherein each switch in said first plurality of switches applies a programming input signal stored in said register to a programming signal input terminal in either of the two logic groups in a predetermined pair of logic groups.

14. The apparatus defined in claim 6 further comprising:

at least one output pin normally functionally associated with each regular logic group; and a second switch associated with each output pin for connecting each output pin to either a first conductor in the regular logic group associated with that output pin or a first conductor in another logic group.

15. The apparatus defined in claim 14 wherein said logic groups are paired in predetermined pairs, and wherein each second switch connects the associated output pin to either a first conductor in the regular logic group associated with that output pin or a first conductor in the other logic group in the predetermined pair which includes the regular logic group associated with that output pin.

16. The apparatus defined in claim 15 wherein each switch in said first plurality of switches applies a programming input signal stored in said register to a programming signal input terminal in either of the two logic groups in a predetermined pair of logic groups.

17. A programmable, integrated circuit, logic array device comprising:

a plurality of regular logic groups and at least one spare logic group, each of said logic groups having a plurality of logic modules, a plurality of programming signal input terminals, a plurality of data input terminals, a plurality of data output terminals, and a plurality of first conductors, each of said first conductors being capable of conveying data signals in either direction along said first conductor among the logic modules in the logic group of which said first conductor is a component;

a plurality of second conductors, each of said second conductors being capable of conveying data signals in either direction along said second conductor between said logic groups; and a first plurality of switches, each of which connects a second conductor to a data output terminal of either of two logic groups.

18. The apparatus defined in claim 17 further comprising:

memory circuitry associated with each of said regular logic groups for indicating whether or not the associated logic group is defective, said first plurality of switches being responsive to said memory circuitry.

19. The apparatus defined in claim 18 wherein said memory circuitry is selected from the group consisting of fuses, antifuses, RAM cells, metal optional links, EPROMs, EEPROMs, and ferro-electric elements.

20. A programmable, integrated circuit, logic array device comprising:

a plurality of regular logic groups and at least one spare logic group, each of said logic groups being capable of receiving and storing in a programmable programming signal memory a plurality of programming signals for configuring the logic group to perform logic functions on a plurality of data input signals to thereby produce a plurality of data output signals;

first circuitry for indicating whether or not each regular logic group is to perform the logic functions normally performed by that logic group; and second circuitry responsive to said first circuitry for redirecting programming and data input signals that would normally be applied to any logic group that is not to perform its normal logic functions to another logic group, and for substituting the data output signals of said another logic group for the data output signals of the logic group that would normally receive the programming and data input signals that were redirected to said another logic group so that said another logic group can perform all the logic functions that would normally be performed by the logic group that would normally receive the programming and data input signals that were directed to said another logic group, wherein each of said logic groups has a plurality of programming signal input terminals for receiving the programming signals received by that logic group, and wherein said second circuitry comprises:

a register distinct from the programming signal memories of said logic groups for temporarily storing programming signals to be applied to said programming signal input terminals prior to storage of said programming input signals in said programming signal memories; and a plurality of switches for simultaneously applying all of the programming signals stored in said register to all of the programming signal input terminals of either all of said regular logic groups or said spare logic group and a subset of said regular logic groups so that said spare logic group takes the place of a regular logic group which is not included in said subset.

21. The apparatus defined in claim 20 wherein said register comprises a plurality of groups of plural register stages, the register stages in each group storing the programming signals which are normally applied to a respective associated one of said regular logic groups, each switch in said first plurality of switches being connected between (1) a register stage and (2) a respective one of the programming signal input terminals in the associated regular logic group and a respective one of the programming signal input terminals in another regular or spare logic group.

22. The apparatus defined in claim 21 wherein said regular and spare logic groups are disposed on said integrated circuit in an ordered sequence, said spare logic group being at one end of said sequence, and wherein each of said first plurality of switches applies a programming signal applied to it to a programming signal input terminal of either of two adjacent logic groups in said sequence.

23. A programmable, integrated circuit, logic array device comprising:

a plurality of logic array blocks disposed on said device in a two-dimensional array which includes a plurality of rows of said logic array blocks and a plurality of columns of said logic array blocks, each of said logic array blocks being disposed at a respective intersection of a row and a column of said logic array blocks, each of said logic array blocks being capable of receiving and storing a plurality of programming signals for configuring the logic array block to perform logic functions on a plurality of data input signals to thereby produce a plurality of data output signals;

a plurality of first conductors passing adjacent to each column of logic array blocks, each of said first conductors extending adjacent to all of the logic array blocks in the column to which said first conductor is adjacent;

a plurality of second conductors passing adjacent to each row of logic array blocks, each of said second conductors extending adjacent to all of the logic array blocks in the row to which said first conductor is adjacent;

first logic circuitry associated with each of said logic array blocks for selectively applying signals from selected ones of said conductors that are adjacent to said logic array block to said logic array block as said data input signals of said logic array block;

second logic circuitry associated with each of said logic array blocks for selectively applying said data output signals of said logic array block to selected ones of said conductors that are adjacent to said logic array block; and a plurality of switches, at least one of said switches being associated with each of said second conductors for connecting to said associated second conductor either of two of said first conductors that are associated with said switch, each of said two first conductors that are associated with each of said switches being adjacent to a respective one of two of said columns.

24. The apparatus defined in claim 23 further comprising:

a plurality of programming signal sources; and a plurality of second switches, each of said second switches being associated with a respective one of said programming signal sources, and each of said second switches applying programming signals from the associated programming signal source to the logic array blocks in either of two of said columns.

25. The apparatus defined in claim 23 further comprising:

a plurality of input terminals; and a plurality of second switches, each of said second switches being associated with a respective one of said input terminals, and each of said second switches applying signals from the associated input terminal to either of two first conductors associated with said second switch, each of said two first conductors that are associated with each of said switches being adjacent to a respective one of two of said columns.

26. The apparatus defined in claim 23 further comprising:

a plurality of output terminals; and a plurality of second switches, each of said second switches being associated with a respective one of said output terminals for connecting to said associated output terminal either of two of said first conductors that are associated with said switch, each of said two first conductors that are associated with each of said switches being adjacent to a respective one of two of said columns.

27. The apparatus defined in claim 24 wherein each of substantially all of said columns has an associated primary allocation of logic functions, wherein for each of substantially all of said columns there is another associated column designated to perform the logic functions primarily allocated to said column in the event that said column cannot perform said primarily allocated logic functions, wherein the two first conductors that are associated with each of said switches are respectively adjacent to a predetermined column and the column designated to perform the logic functions primarily allocated to said predetermined column in the event that said predetermined column cannot perform said primarily allocated logic functions, and wherein said logic array blocks in said two of said columns are also in a predetermined column and the column designated to perform the logic functions primarily allocated to said predetermined column in the event that said predetermined column cannot perform said primarily allocated logic functions.

28. The apparatus defined in claim 25 wherein each of substantially all of said columns has an associated primary allocation of logic functions, wherein for each of substantially all of said columns there is another associated column designated to perform the logic functions primarily allocated to said column in the event that said column cannot perform said primarily allocated logic functions, wherein the two first conductors that are associated with each of said switches are respectively adjacent to a predetermined column and the column designated to perform the logic functions primarily allocated to said predetermined column in the event that said predetermined column cannot perform said primarily allocated logic functions, and wherein the two first conductors that are associated with each of said second switches are also respectively adjacent to a predetermined column and the column designated to perform the logic functions primarily allocated to said predetermined column in the event that said predetermined column cannot perform said primarily allocated logic functions.

29. The apparatus defined in claim 26 wherein each of substantially all of said columns has an associated primary allocation of logic functions, wherein for each of substantially all of said columns there is another associated column designated to perform the logic functions primarily allocated to said column in the event that said column cannot perform said primarily allocated logic functions, wherein the two first conductors that are associated with each of said switches are respectively adjacent to a predetermined column and the column designated to perform the logic functions primarily allocated to said predetermined column in the event that said predetermined column cannot perform said primarily allocated logic functions, and wherein the two first conductors that are associated with each of said second switches are also respectively adjacent to a predetermined column and the column designated to perform the logic functions primarily allocated to said predetermined column in the event that said predetermined column cannot perform said primarily allocated logic functions.

* * * * *